US008282281B2

(12) United States Patent
Heiland

(10) Patent No.: US 8,282,281 B2
(45) Date of Patent: Oct. 9, 2012

(54) AIR BEARING WITH CONSIDERATION OF HIGH-FREQUENCY RESONANCES

(75) Inventor: Peter Heiland, Raunheim (DE)

(73) Assignee: Integrated Dynamics Engineering GmbH (DE)

( * ) Notice: Subject to any disclaimer, the term of this patent is extended or adjusted under 35 U.S.C. 154(b) by 1023 days.

(21) Appl. No.: 12/030,811

(22) Filed: Feb. 13, 2008

(65) Prior Publication Data

US 2008/0193061 A1 Aug. 14, 2008

(30) Foreign Application Priority Data

Feb. 14, 2007 (DE) .......................... 10 2007 007 909

(51) Int. Cl.
*F16C 32/06* (2006.01)
*F16F 5/00* (2006.01)
*F16M 11/00* (2006.01)

(52) U.S. Cl. .................. 384/12; 267/64.11; 267/136

(58) Field of Classification Search ............... 384/12; 248/562, 631, 638; 267/64.11, 136; 355/72, 355/73, 75, 76

See application file for complete search history.

(56) References Cited

U.S. PATENT DOCUMENTS

| | | | | |
|---|---|---|---|---|
| 3,559,825 | A * | 2/1971 | Meyer et al. | 414/525.54 |
| 3,667,631 | A * | 6/1972 | Bishop | 414/563 |
| 5,011,108 | A * | 4/1991 | Chen et al. | 248/550 |
| 6,226,075 | B1 * | 5/2001 | Loopstra et al. | 355/76 |
| 7,095,482 | B2 * | 8/2006 | Phillips et al. | 355/53 |
| 7,145,642 | B2 * | 12/2006 | Ogatsu | 355/72 |
| 2001/0027727 | A1 | 10/2001 | Miyachi et al. | |
| 2004/0001188 | A1 | 1/2004 | Janssen et al. | |
| 2004/0065517 | A1 | 4/2004 | Watson et al. | |

FOREIGN PATENT DOCUMENTS

| | | |
|---|---|---|
| EP | 1803965 A2 | 7/2007 |
| JP | 2001503203 | 3/2001 |
| JP | 2001141361 A * | 5/2001 |
| WO | 9905573 A1 | 2/1999 |

OTHER PUBLICATIONS

"European Office Action for European International Application No. EP 08 002 728.7", Dated: Apr. 29, 2011, Publisher: European Patent Office, Published in: EP.
Paul Pemberton, "EP Patent Application No. EP 08 00 2728 International Search Report", Oct. 6, 2008, Publisher: EPO, Published in: EP.
Japanese Office Action dated May 24, 2012 of Japanese Patent Application No. 2008-033530.

* cited by examiner

*Primary Examiner* — Thomas R Hannon
*Assistant Examiner* — Adam D Rogers
(74) *Attorney, Agent, or Firm* — Kaplan Breyer Schwarz & Ottesen, LLP

(57) ABSTRACT

A vertically and horizontally effective air bearing comprising a base, an interface part that is movably arranged on the base, a piston that is movably arranged inside the interface part and supports a load, and a coupling element that couples the piston with the load. The load is supported in a manner to be isolated from vibration in the horizontal and vertical directions with respect to the base, and the coupling element preferably comprises a pin that is coupled to the piston. The coupling element is spaced from the load by at least one quarter of the length of the piston.

6 Claims, 5 Drawing Sheets

AIR BEARING WITH CONSIDERATION OF HIGH-FREQUENCY RESONANCES

FIELD OF THE INVENTION

The invention relates to an air bearing.

BACKGROUND OF THE INVENTION

Air bearings for vibration isolation are known. For example, European patent application EP 1 803 965 entitled "Isolator Geometry of a vibration isolation system" (application number 06 026 425.1) shows an air bearing with increased bearing force. The disclosure of this document is incorporated herein by reference.

Air bearings of this type have a mechanical coupling element between a vertical piston and a piston plate or a load, respectively. In this way, while vertical forces are transferred to the piston plate, horizontal forces are essentially not. Also, changes of the parallelism of the piston plate with respect to the base plate are not transferred, which prevents tilting of the isolator pistons within each other.

Without taking into consideration isolator-internal structural resonances, known vibration isolation systems according to the air bearing principle are designed for a frequency range up to approximately 100 Hz (max. 300 Hz). However, with the continuing enhancement of resolution and precision of lithography devices, steppers and immersion systems, frequency characteristics above 300 Hz become more and more important. Therefore, it is important to optimize the frequency behaviour of the air bearing itself to maintain the isolation effect even when exceeding 300 Hz. Besides other effects that are relevant in prior art air bearings, the mechanical coupling element is of decisive importance. On the one hand, the weight to be supported bears thereon, on the other hand, it is the only element between the load to be supported and the isolator. The element which is screwed in the piston plate (at its upper end) is neglectable in comparison to the lower element which is screwed in the vertical piston of the air bearing, because it is considerably smaller. The lower element (which is referred to as pin) exhibits a mechanical stiffness which depends on the employed material, the length of the pin, the thread thickness of the screw connection and the supporting area of the screw connection. In known air bearings, this mechanical stiffness is adapted to be sufficient in case of a static load, but is particularly not designed as a dynamic stiffness and for dynamic resonances.

In known air bearings, a deflection of the pin is likely to be caused which together with the piston and the air cushion to the horizontal bearing, forms a vibratory system, with eigenfrequencies mostly above 300 Hz. As a result, the isolation effect is reduced in frequency ranges above 300 Hz.

It has been realized that this effect may only be reduced partially by changing the system parameters "bearing load" and "air cushion to the horizontal bearing".

OBJECT OF THE INVENTION

An object of the invention is to at least reduce the aforementioned disadvantages.

Particularly, it is an object of the invention to design a pin in such a manner that it meets the requirements on mechanical stiffness for a static load and at the same time has a dynamic stiffness which minimizes the eigenresonances of the system "pin+piston".

SUMMARY OF THE INVENTION

Accordingly, a vertically and horizontally effective air bearing is provided, which has a base, an interface part which is movably arranged on the base, a piston which is movably arranged inside the interface part and supports a load, the load being supported in a manner to be isolated from vibration in horizontal and vertical directions with respect to the base, and a coupling element which couples the piston with the load, wherein the coupling element preferably comprises a pin, which is coupled to the piston, in particular by being screwed into the piston.

According to the invention, the coupling element, which couples the piston with the load, is spaced from the load by at least one fourth, preferably one half of the piston length.

Thus, this embodiment of the invention is a different approach, since instead of shifting the resonance into frequency ranges that are irrelevant for the whole system, the forces transferred at the coupling element are offset with their plane of effect in such a manner that the piston no longer tends to dump and therefore does not form a vibratory mechanical impedance.

This is effected in a surprisingly easy manner by adapting the coupling element such that the coupling point between piston and load is spaced from the load by at least one fourth of the piston length.

In this way the connection which is preferably established via a pin or a threaded connection is offset downwards, into the piston, which eliminates the tendency of the piston to dump.

In a further embodiment of the invention, the coupling element includes a preferably generally pyramid-shaped or cone-shaped extension which extends into the piston from above and which is coupled to the piston. Preferably, the extension tapers towards the base plate.

The term "preferably pyramid-shaped or cone-shaped" is intended to include not only extensions that form a complete cone, but also extensions that are comprised for example of individual segments spaced from each other.

The diameter of the extension, which diameter preferably extends in the direction to the base, does not exclusively relate to an extension having a circular cross section, rather the extension may also have a polygon-shaped and preferably a square cross section.

In another preferred embodiment of the invention, a further extension is attached to the load, which further extension is coupled to the coupling element.

This further extension preferably extends inside the first extension, and also tapers towards the base.

An alternative embodiment of the invention also relates to vertically and horizontally effective air bearing with a base, an interface part, which is movably arranged on the base, and a piston, which is movably arranged inside the interface part and supports a load, which is vibration isolated supported in horizontal and vertical directions with respect to the base. Thus, the coupling element connects the piston with the load, wherein the coupling element has a pin, connected to the piston, preferably screwed into the piston.

The inventors have found that by selecting a pin with a length to diameter ratio smaller than 0.7, preferably smaller than 0.5 and more preferably smaller than 0.2, a decrease of the isolation effect caused by resonances can largely be avoided in frequency ranges above 300 Hz.

In this context, the ratio of the "load" to the stiffness of the pin seems to be decisive for the structural resonance of the whole air bearing system to be expected. The smaller this ratio, the less structural resonances are to be expected and the better the isolator is set up in view of future requirements.

Alternatively or in combination, a pin is used, which has a minimum diameter of 30 mm, preferably a minimum of 35 mm, and more preferably 40 mm.

The pin has a length smaller than 18 mm, preferably smaller than 10 mm, and more preferably smaller than 6 mm.

Furthermore, the pin is preferably threaded, with a ratio of the thread diameter to the length of the piston of more than 0.8, preferably more than 1.5, and more preferably more than 3. In particular, the thread has a diameter of more than 10 mm, preferably of more than 15 mm, and more preferably of more than 20 mm.

For enhanced stiffness, the pin is preferably made of steel, titanium, or an alloy thereof.

BRIEF DESCRIPTION OF THE DRAWINGS

The invention will now be described in detail with reference to the drawings of FIG. 1 to FIG. 6.

DETAILED DESCRIPTION OF THE DRAWINGS

Figure 1:
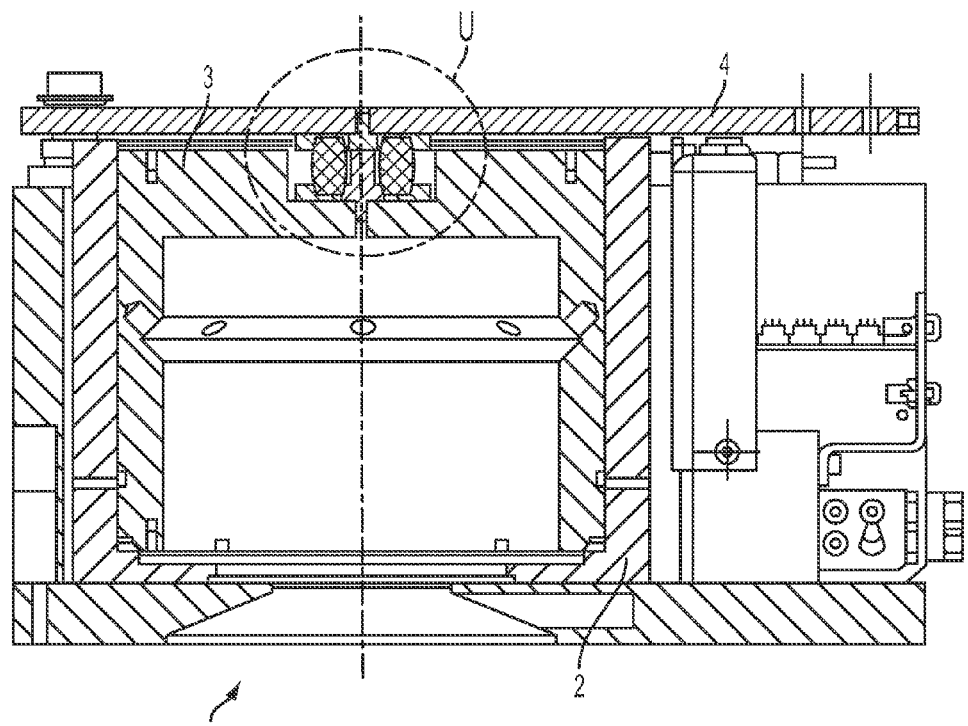
FIG. 1 shows an air bearing of a nature known in the art.

FIG. 1 shows an air bearing 1 of a nature known in the art. This air bearing comprises, inter alia, an interface part 2, in which a piston 3 is mounted in vibration isolated manner. A load 4 to be isolated is coupled with the piston via a coupling element (detail U).

Figure 2:
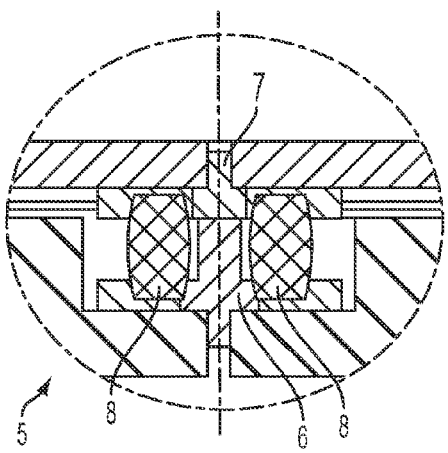
FIG. 2 shows a detailed view of a coupling element known in the art.

FIG. 2 shows a detailed view of the coupling element 5. The coupling element comprises a lower pin 6 which is screwed into the piston (3 in FIG. 1), and an upper pin which is screwed into the load to be isolated, or into the piston plate (4 in FIG. 1). Furthermore, the coupling element comprises a rubber buffer 8 in form of a generally annular spring member. Upper pin 7 bears on lower pin 6.

Figure 3:
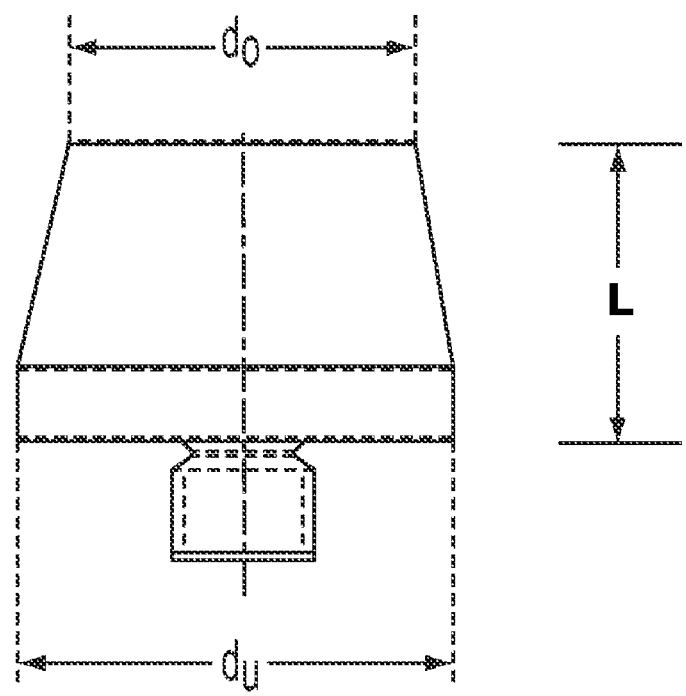
FIG. 3 shows a sectional view of a first embodiment in which the geometry of the pin of the coupling element is optimized.

FIG. 3 shows a schematic view of lower pin 6 to which the invention refers. The pin has a generally cylindrical shape, with a slight chamfer at an upper end. Therefore, the pin has an upper diameter $d_O$ which is smaller than the lower diameter $d_U$ thereof. In the sense of the invention, the specifications concerning the diameter may relate to the lower diameter as well as to the upper diameter. The pin has a length L, excluding the length of the thread. The inventors have found that interferences in a range above 300 Hz caused by resonance can be reduced or widely avoided by the (claimed) length to diameter ratio.

Furthermore, the pin 6 has a thread for screwing the pin in the piston (3 in FIG. 1). The thread preferably has a diameter of more than 20 mm, especially it is formed as a M24 or a M30 thread.

Figure 4:
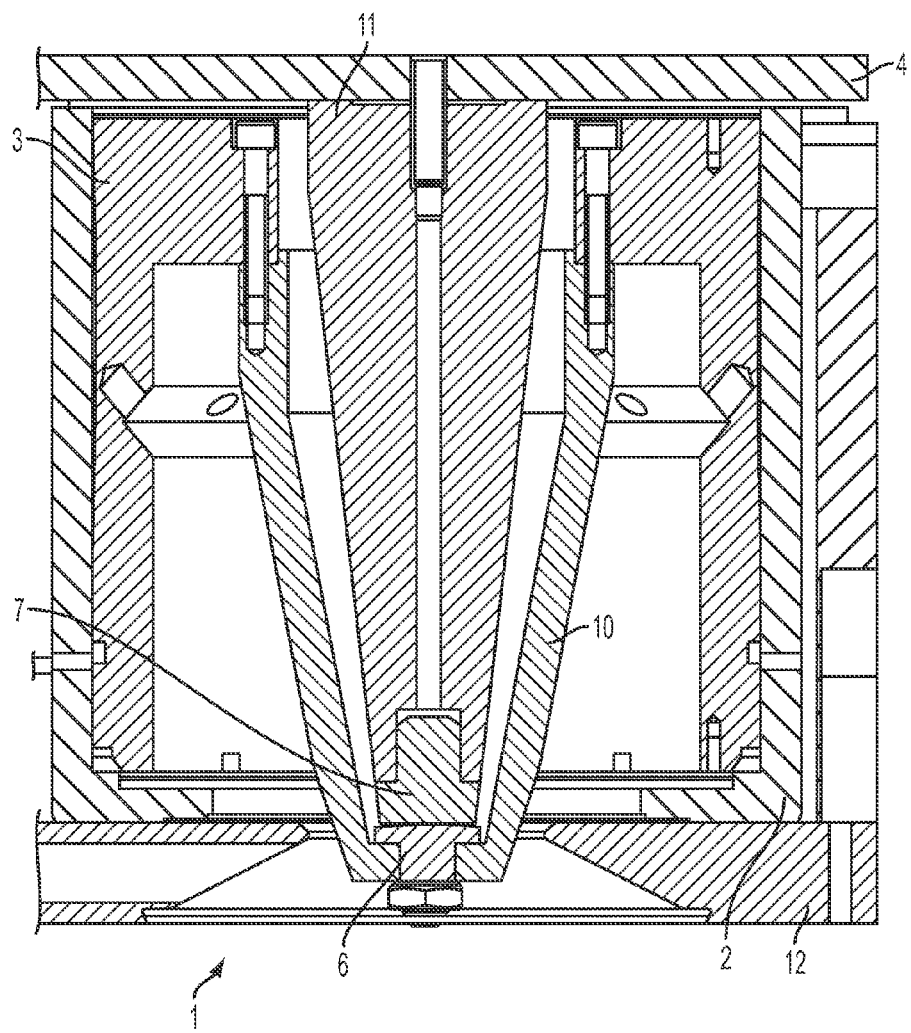
FIG. 4 and FIG. 5 show embodiments of the invention in which the coupling element is arranged at about the level of the base plate.

FIG. 4 shows a sectional schematic view of an alternative embodiment of the invention in which the coupling element which defines the contact point between piston 3 and load 4 is offset towards base 12.

For that purpose, air bearing 1 has a first extension 10 which has an upper end coupled to piston 3, via a threaded connection in the present case, and which essentially extends up to base 12 of air bearing 1.

In this embodiment, first extension 10 is generally in form of a hollow cylinder.

A further extension 11 is attached to the load, and the further extension extends downwards inside the first extension 10.

Thus, the contact point between first extension 10 and the further extension 11, and therefore between load 4 and piston 3, which point is eventually defined by the coupling element formed by lower pin 6 and upper pin 7, is offset downwards, towards base 12.

Further extension 11 is fixedly screwed to the load at its upper end.

By offsetting the contact point between lower pin 6 and upper pin 7, the tendency of the piston 3 to dump is reduced in such a manner that disturbing eigenfrequencies are largely eliminated.

Figure 5:
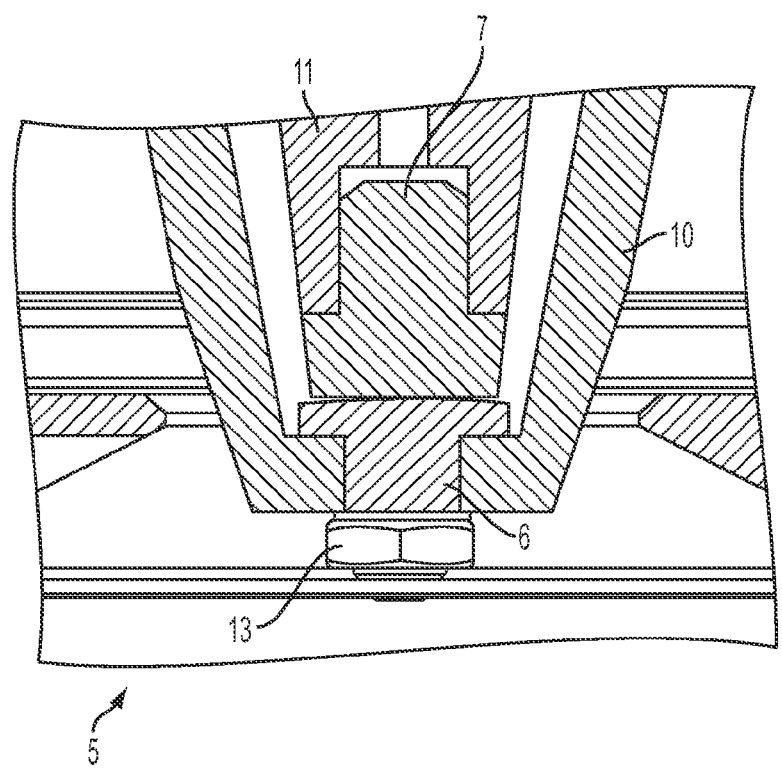

FIG. 5 shows a detailed view of the coupling element 5 of FIG. 4.

In this embodiment, coupling element 5 is made up of a lower 6 and an upper pin 7, which are threadedly coupled to first extension 10 and to second extension 11 by means of a thread (not shown) and a threaded nut 13.

First and/or second pins 6, 7 may be made of elastic material to reduce the transfer of vibrations.

Figure 6:
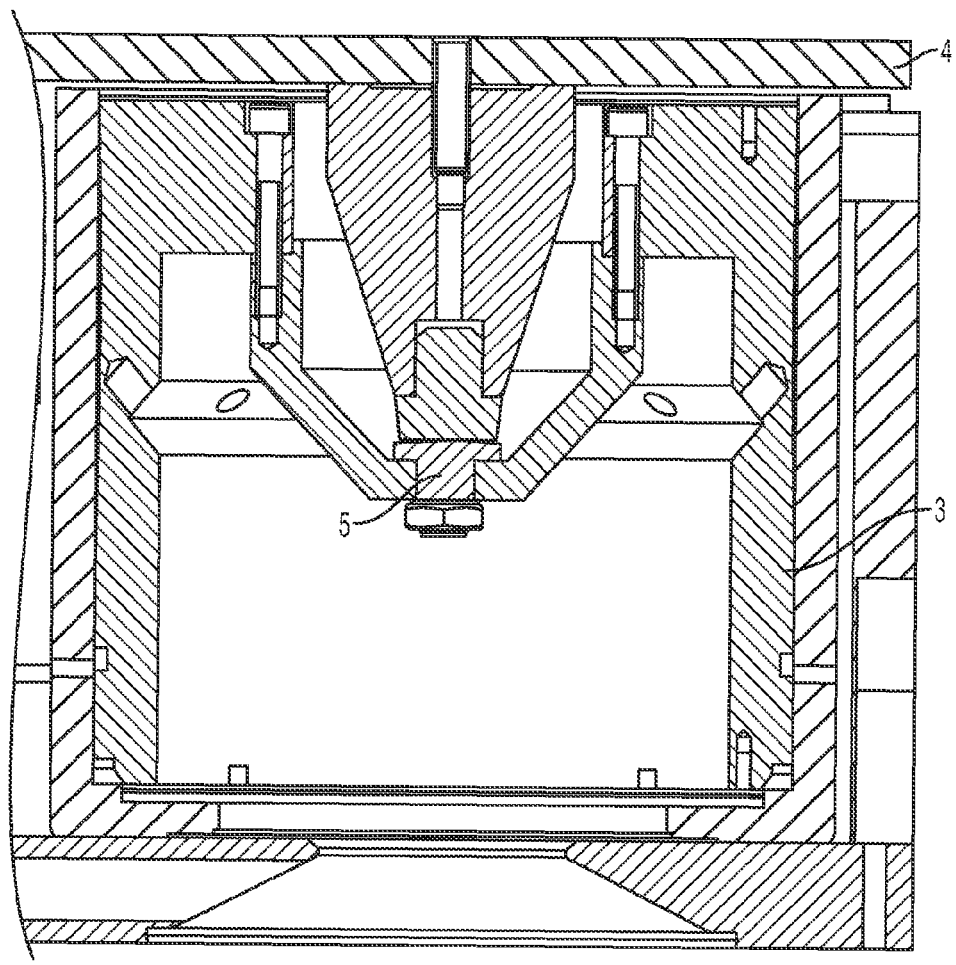
FIG. 6 shows yet another embodiment of the invention in which the coupling element is arranged at about half the length of the piston.

FIG. 6 shows another embodiment in which coupling element 5 is arranged further down towards load 4 than in the case of the embodiment according to FIG. 4. Here, coupling element 5 is arranged at about half the length of piston 3.

It will be understood that the invention is not limited to a combination of the feature described above, rather a person skilled in the art will combine any features as far as useful.

The invention claimed is:

1. A vertically and horizontally effective air bearing comprising:
    a base of the air bearing;
    an interface part that is movably arranged on the base;
    a piston that is movably arranged inside the interface part and supports a load plate, the load plate being supported in a manner to be isolated from vibration in horizontal and vertical directions; and
    a coupling element that couples the piston with the load plate;
    wherein the coupling element is spaced from the load plate by at least one quarter of the length of the piston;
    wherein the coupling element is coupled to the piston by means of an extension that extends into the piston from above;
    wherein a further extension is attached to the load plate, and wherein the further extension extends towards the base and is coupled to the coupling element.

2. The vertically and horizontally effective air bearing according to claim 1, wherein the coupling element comprises a pin that is coupled to the piston.

3. The vertically and horizontally effective air bearing according to claim 1, wherein the coupling element is spaced from the load plate by at least one third of the length of the piston.

4. The vertically and horizontally effective air bearing according to claim 1, wherein the extension tapers towards the base.

5. The vertically and horizontally effective air bearing according to claim 1, wherein the further extension tapers towards the base.

6. The vertically and horizontally effective air bearing according to claim 1, wherein the further extension is arranged inside the extension that is arranged at the piston.

* * * * *